US006123984A

United States Patent [19]

Fumio

[11] Patent Number: 6,123,984

[45] Date of Patent: Sep. 26, 2000

[54] METHOD AND APPARATUS FOR PLATING A SUBSTRATE

[75] Inventor: Kuriyama Fumio, Yokohama, Japan

[73] Assignee: Ebara Corporation, Tokyo, Japan

[21] Appl. No.: 09/153,895

[22] Filed: Sep. 16, 1998

[30] Foreign Application Priority Data

Sep. 16, 1997 [JP] Japan .................................... 9-269302

[51] Int. Cl.[7] ........................................................ B05D 5/12

[52] U.S. Cl. ................................................ 427/98; 427/96

[58] Field of Search ............................ 427/96, 98, 255.1, 427/377

[56] References Cited

U.S. PATENT DOCUMENTS 5,403,621 4/1995 Jackson et al. .

*Primary Examiner*—Diana Dudash
*Assistant Examiner*—Paul D. Strain
*Attorney, Agent, or Firm*—Wenderoth, Lind & Ponack, L.L.P.

[57] ABSTRACT

A method and apparatus can produce a sound metal deposit inside fine cavities fabricated on a substrate such as a semiconductor wafer through pre-plating treatment process for smoothly filling the fine cavities with plating solution. The method comprises disposing the substrate in a hermetic chamber, filling the chamber with a treatment medium which is liquid at normal temperature and pressure, maintaining the treatment medium within the chamber at a subcritical or supercritical state. The treatment medium within the chamber is finally converted into liquid phase without passing through a vapor phase by controlling pressure and temperature within the chamber so as to infiltrate the treatment medium into the fine cavities.

10 Claims, 7 Drawing Sheets

F I G. 2
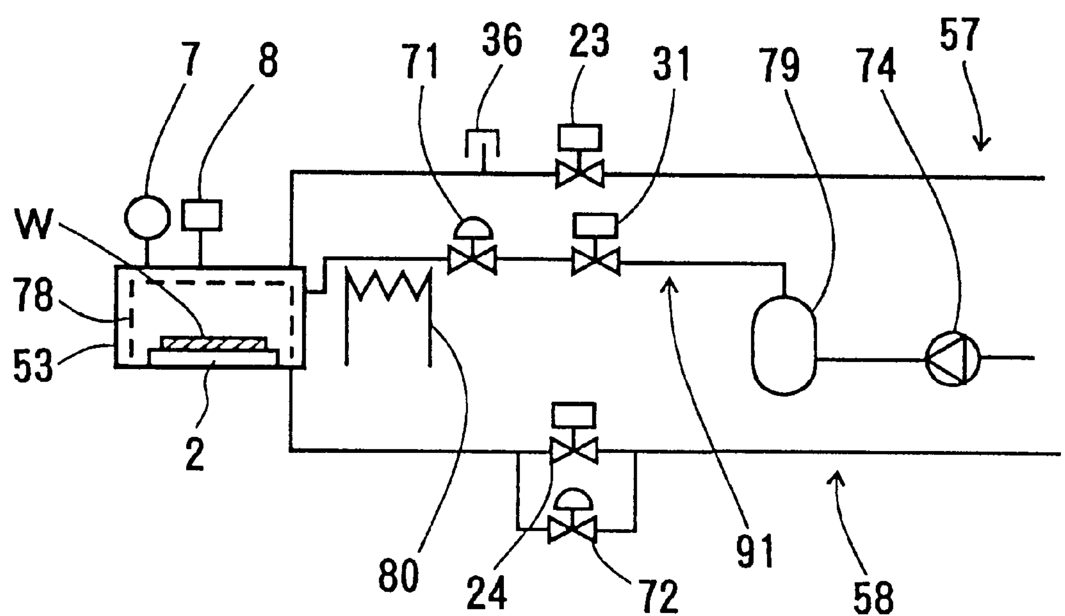

liquid phase mixed phase vapor phase

F I G. 5
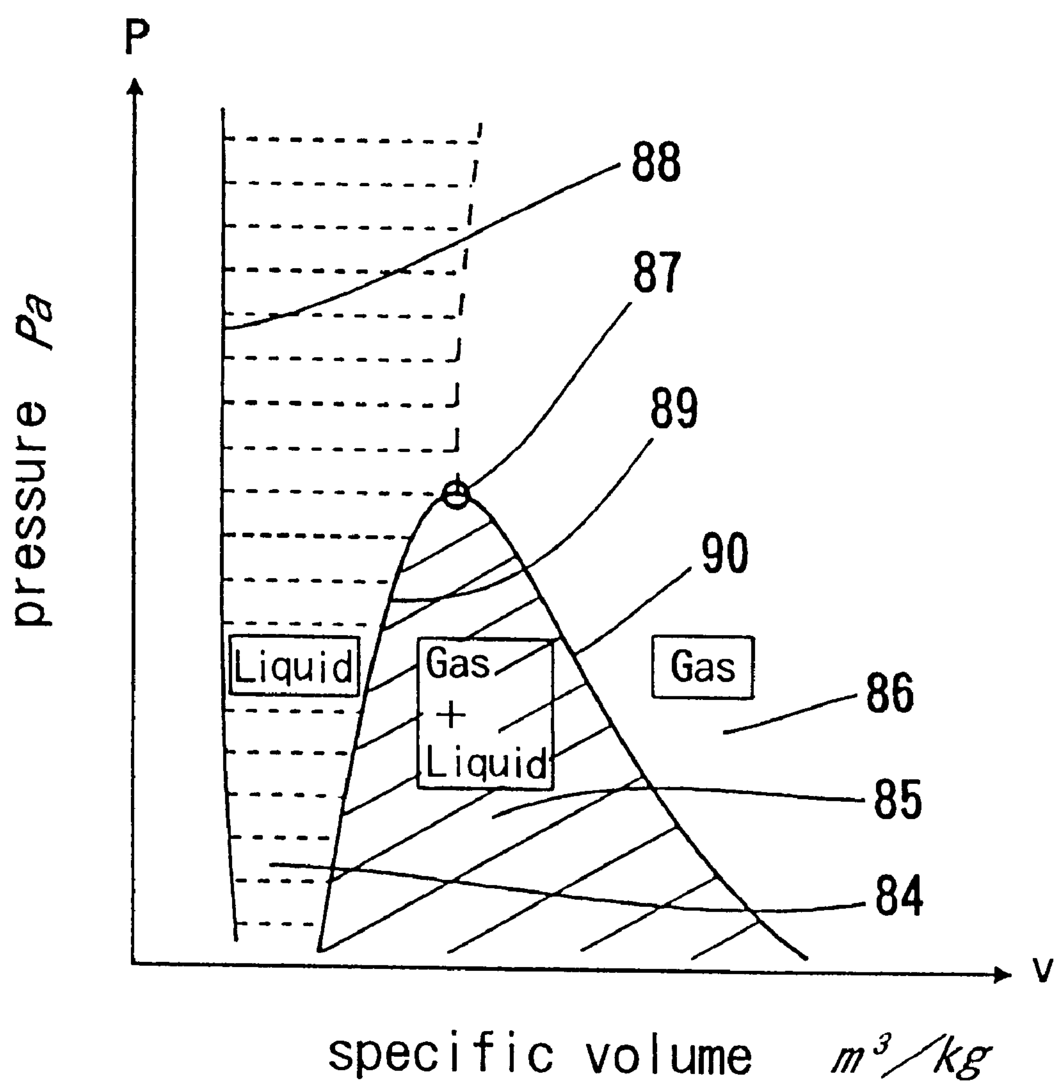

F I G. 6
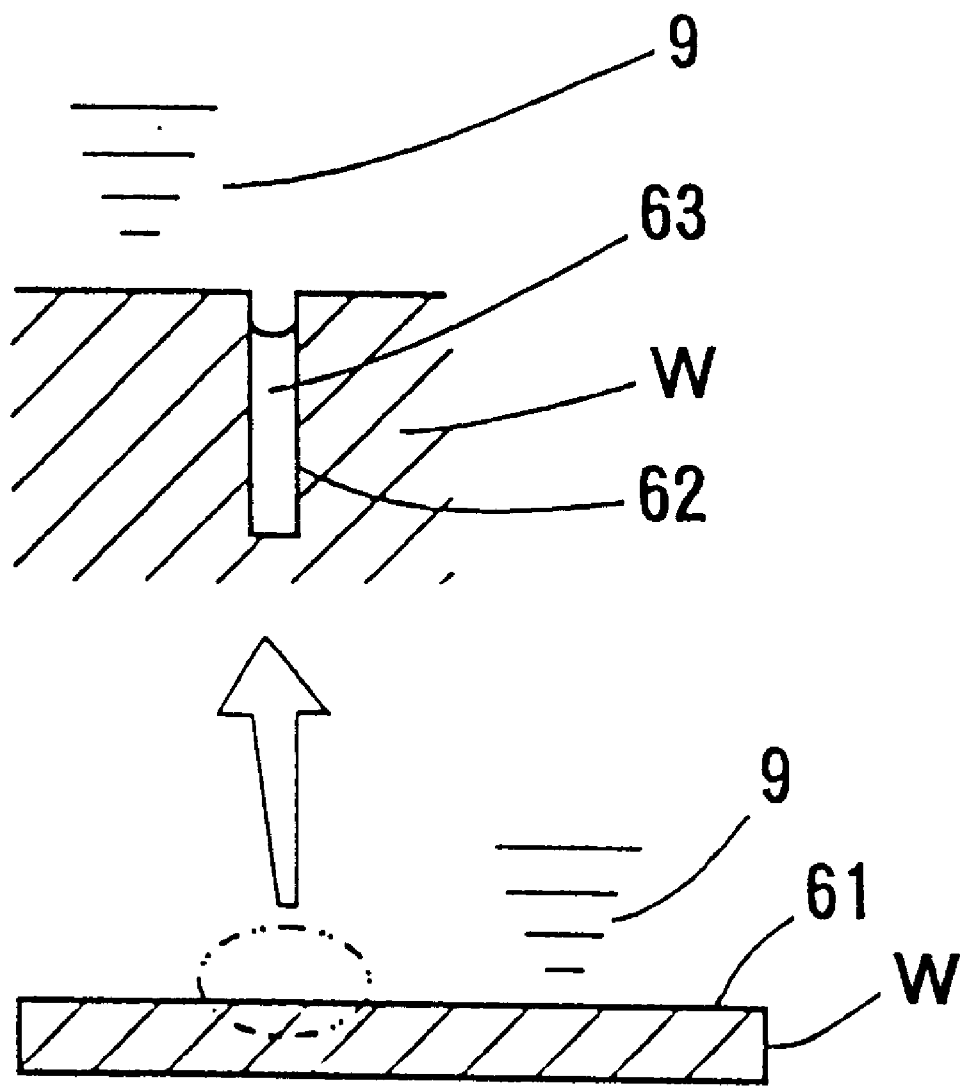

METHOD AND APPARATUS FOR PLATING A SUBSTRATE

BACKGROUND OF THE INVENTION

1. Field of the Invention

The present invention relates to metal wiring fabrication processes for next generation devices, and relates in particular to a method and apparatus for producing a metal deposit inside fine cavities fabricated on a substrate.

2. Description of the Related Art

In conventional semiconductor integrated circuits, elements such as transistors, resistors and capacitors are connected by aluminum wiring. Aluminum wiring is fabricated by forming an aluminum film on a substrate by sputtering process, forming a photo-resist film on the aluminum film, printing wiring patterns on the photo-resist film, and etching the aluminum film to leave wiring lines. As integration density increases, there is a demand for finer interconnection lines, but there have been some problems caused by the properties of aluminum material itself. However, the etching method is sometimes not applicable to forming wiring patterns using other metals, and a different approach is necessary. A substitute method for such cases is, to fabricate grooves and holes for wiring purposes on the substrate, and fill the cavities with metals using such methods as chemical vapor deposition (CVD), sputtering or plating, and then the unnecessary surface layer is removed by using methods such as chemical mechanical polishing (CMP).

Plating is used widely as a metal film forming technique, and has many good features. FIG. 7 shows a basic plating apparatus. A plating chamber 1 holds plating solution 9, and an anode electrode 4 holding a substrate W is opposed by a cathode electrode 3. A stirrer 11 is provided to stir plating solution 9 during plating process. Pre-plating treatment for plating includes washing or etching of the substrate. Plating is advantageous because of its relatively low cost, and high purity material can be produced using a low temperature process which produce no adverse thermal degradation in the plated product.

However, since it is difficult to force the plating solution into fine cavities fabricated on the wafer, the current plating technology is rarely able to fill deep cavities of a high aspect ratio successfully with metals. Even if the substrate is immersed in the plating solution, the cavities are occupied by residual air, and, as illustrated in FIG. 6, complete infiltration is not possible and voids are generated in the deposited metal. It is considered that wettability of the substrate material and surface tension of the plating solution have a large influence on the infiltration behavior, and the difficulty increases with decreasing width of the cavities.

SUMMARY OF THE INVENTION

It is an object of the present invention to provide a method and apparatus for producing a sound metal deposit inside fine cavities fabricated on a substrate such as a semiconductor wafer, so as to fabricate wiring of an integrated circuit device, for example, through pre-plating treatment process for smoothly filling the fine cavities with plating solution.

The object has been achieved in a method for producing a metal deposit inside fine cavities fabricated on a substrate, the method comprising: disposing the substrate in a hermetic chamber; filling the chamber with a treatment medium which is liquid at normal temperature and pressure; maintaining the treatment medium within the chamber at a subcritical or supercritical state; and converting the treatment medium within the chamber into liquid phase without passing through a vapor phase by controlling pressure and temperature within the chamber so as to infiltrate the liquid-phase treatment medium into the fine cavities.

The present invention utilizes the properties of a substance in a supercritical state. FIG. 3 is a graph showing a saturated vapor pressure curve for water on which phase changes vapor to and from liquid. For example, as shown in FIG. 4, suppose 1 kg mass of water is placed inside a cylinder and heated, such a system undergoes various states, such as a liquid phase, a coexistent state of liquid and vapor phases, and a vapor phase, depending on temperature and pressure. The phase relationship in such a system can be described in terms of pressure and specific volume in a graph shown in FIG. 5. Above a certain pressure, the system can not become a coexistent state of vapor and liquid phases, but it becomes a homogeneous single phase that changes without vaporization. The point that initiates such a phenomenon is called “a critical point”, and above the critical point in pressure and temperature, the system is in “a supercritical state” and near the critical point, the system is in “a subcritical state”.

Liquid lowers its surface tension as the temperature is raised, and at the critical point, the surface tension becomes zero and the system becomes a homogeneous single phase without separating into liquid and vapor phases. Also, when a liquid under a pressure higher than the critical pressure is heated while maintaining the pressure, the liquid changes into vapor without vaporization process which is a coexistent state of liquid and vapor phases. Conversely, this supercritical vapor can be liquefied without condensation process when a vapor heated and pressured higher than the critical point is subsequently cooled at supercritical pressure.

When plating solution or water (a solvent of the plating solution) is subjected to a pressure above 22 MPa (226 kgf/cm$^2$) and a temperature above 374° C. (647 K), it goes into the critical or supercritical state. Under the condition, nitrogen and oxygen, main components of air, go into the supercritical state, so the system within the chamber becomes a homogeneous single phase of water and air. When a substrate having fine surface cavities is placed in such a supercritical state, the air remaining in the cavities is diffused into surroundings and the cavities are substantially filled with water in a supercritical state. By lowering the chamber temperature to room temperature while maintaining supercritical pressure, an then, by lowering the internal pressure to normal pressure, the treatment medium within the chamber is converted into liquid phase of water or plating solution without passing through the vaporization stage so that the cavities can be filled with water or plating solution without being affected by surface tension effects or bubble formation.

The treatment medium is preferably selected from water or plating solution to be used in a subsequent plating process. Such a medium is harmless to any of the fabrication steps to follow. In the high temperature and high pressure state, water, oxygen and nitrogen form a single liquid phase so that the cavities can be filled with the liquid medium without being affected by surface tension or bubble formation.

The treatment medium is preferably a substance whose critical pressure or critical temperature is lower than the critical pressure or critical temperature of water. Accordingly, cavities can be filled with a liquid substance under an easy condition, i.e., at a temperature and pressure lower than the critical temperature of water, which can later be substituted with the plating solution. Therefore, the criteria for selecting a medium are that it should be easily replaceable with plating solution and has no harmful effects in the plating process.

The treatment medium may be alcohol. Accordingly, cavities can be filled with the liquid alcohol at low temperature and pressure, which will be replaced by plating solution only by immersing the pre-treated substrate in the plating solution to proceed with the plating process.

The chamber is preferably evacuated for vacuum prior to filling with the treatment medium. Accordingly, non-condensable gases such as air attached to the cavities can be removed before subjecting the substrate to pre-plating treatment process, therefore, treatment medium such as water or plating solution can be filled in the cavities more thoroughly and quickly.

The treatment medium can be supplied to the chamber in a liquid state or in a vapor state. These variations provide a desirable flexibility to the method. Inner environment of the chamber may be subjected to pressure variation during a process of introducing the treatment medium in a vapor phase. Accordingly, non-condensable gases attached to the cavities can be removed before subjecting the substrate to a pre-plating treatment process, therefore, water or plating solution can be made to fill the cavities more thoroughly and quickly without bubbles.

Another aspect of the invention is an apparatus for producing a metal deposit inside fine cavities fabricated on a substrate, the apparatus comprising: a pressure-tight chamber capable of maintaining a treatment medium, which is liquid at normal temperature and pressure, at a subcritical or supercritical state; a supplying device supplying the treatment medium into the chamber; and a state controlling device for controlling temperature and pressure within the chamber so as to maintain the treatment medium at a subcritical or supercritical state, and thereafter to convert the treatment medium into liquid phase without passing through a vapor phase.

Another aspect of the invention is a method for fabricating wiring by producing a metal deposit inside fine cavities fabricated on a substrate, the method comprising: disposing the substrate in a hermetic chamber; introducing a treatment medium which is liquid at normal temperature and pressure into the chamber; maintaining the treatment medium within the chamber at a subcritical or supercritical state; converting the treatment medium within the chamber to liquid phase without passing through a vapor phase by controlling pressure and temperature within the chamber so as to infiltrate the treatment medium into the fine cavities; plating the substrate to produce a metal deposit inside the fine cavities; and removing unwanted metallic regions deposited on the substrate by chemical mechanical polishing.

As explained above, the present method is based on properties of substance in a supercritical state to enable to infiltrate the fine cavities with plating solution. Such a method enables to prepare substrates which are properly prepared for defect-free plating. Therefore, plating performance is improved to efficiently produce semiconductor substrates of high quality without uncontrolled localized defects, thereby providing a technology to win over highly integrated circuits expected in the future.

BRIEF DESCRIPTION OF THE DRAWINGS

FIG. 2 is a schematic illustration of another embodiment of the pre-plating treatment process according to the present invention;

FIG. 5 is a phase diagram of water;

FIG. 6 is an illustration of residual bubble inside a cavity; and

DESCRIPTION OF THE PREFERRED EMBODIMENTS

Figure 1:
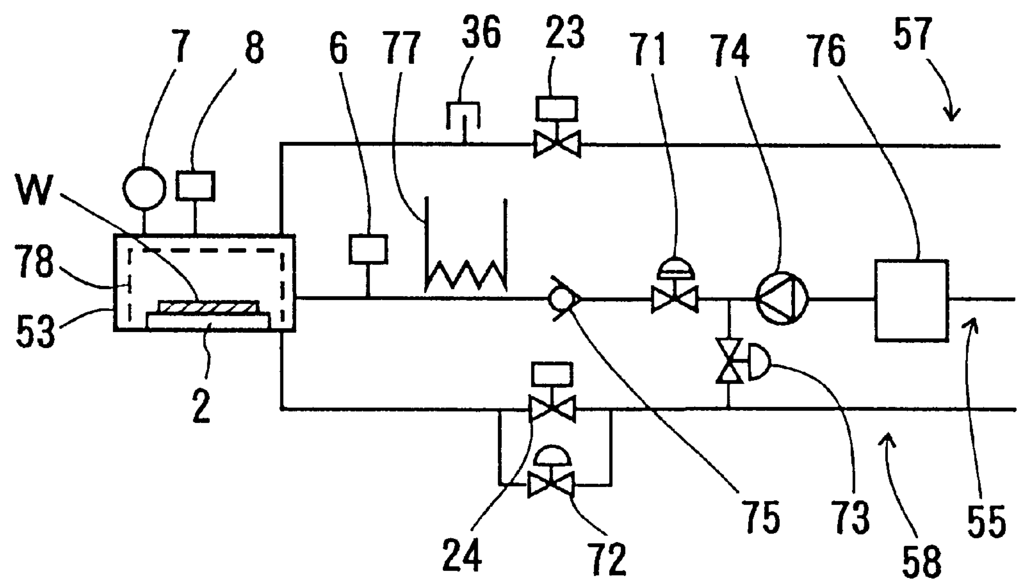
FIG. 1 is a schematic illustration of an embodiment of the pre-plating treatment process according to the present invention.
Figure 3:
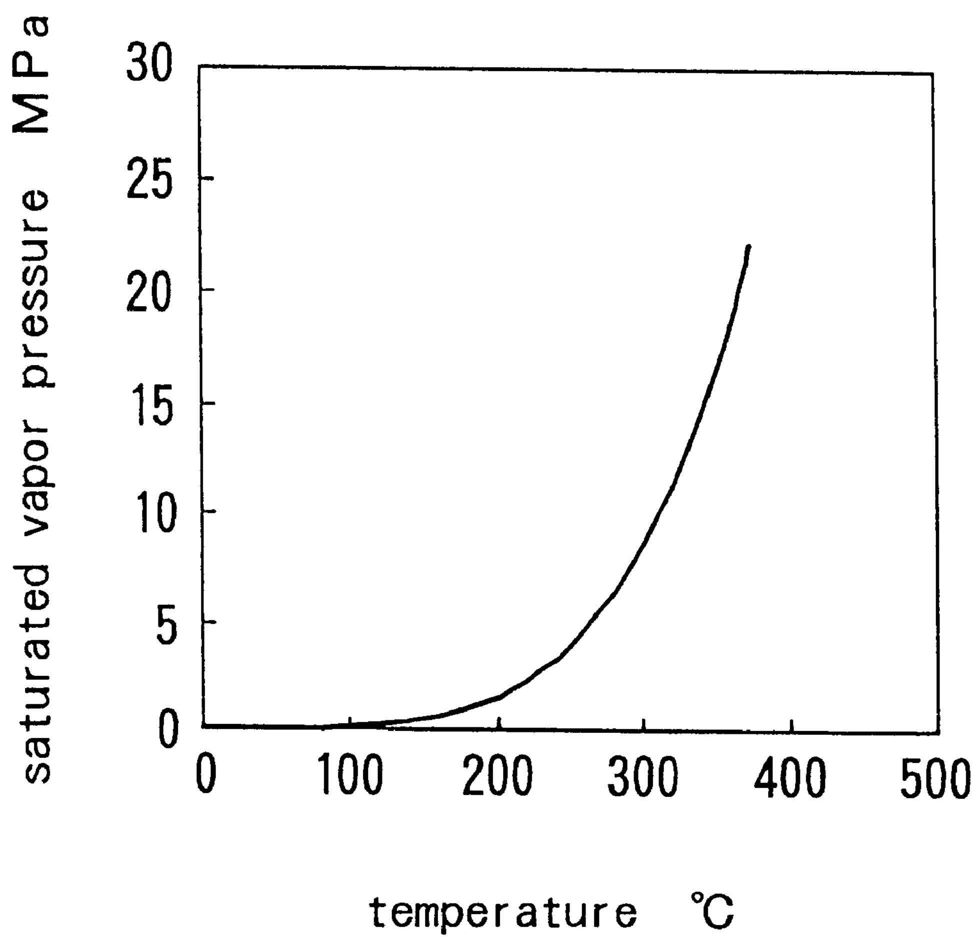
FIG. 3 is a graph showing a saturated vapor pressure curve of water.
Figure 4A:
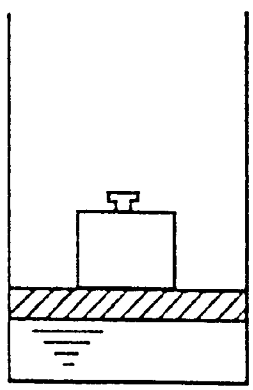
FIG. 4 illustrates phase changes of water occurring in a cylinder.
Figure 4B:
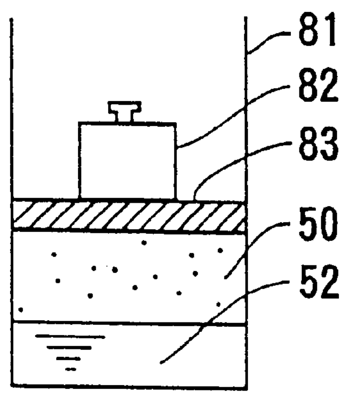
Figure 4C:
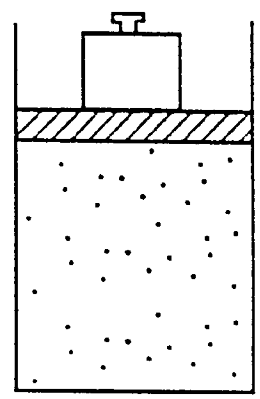
Figure 7:
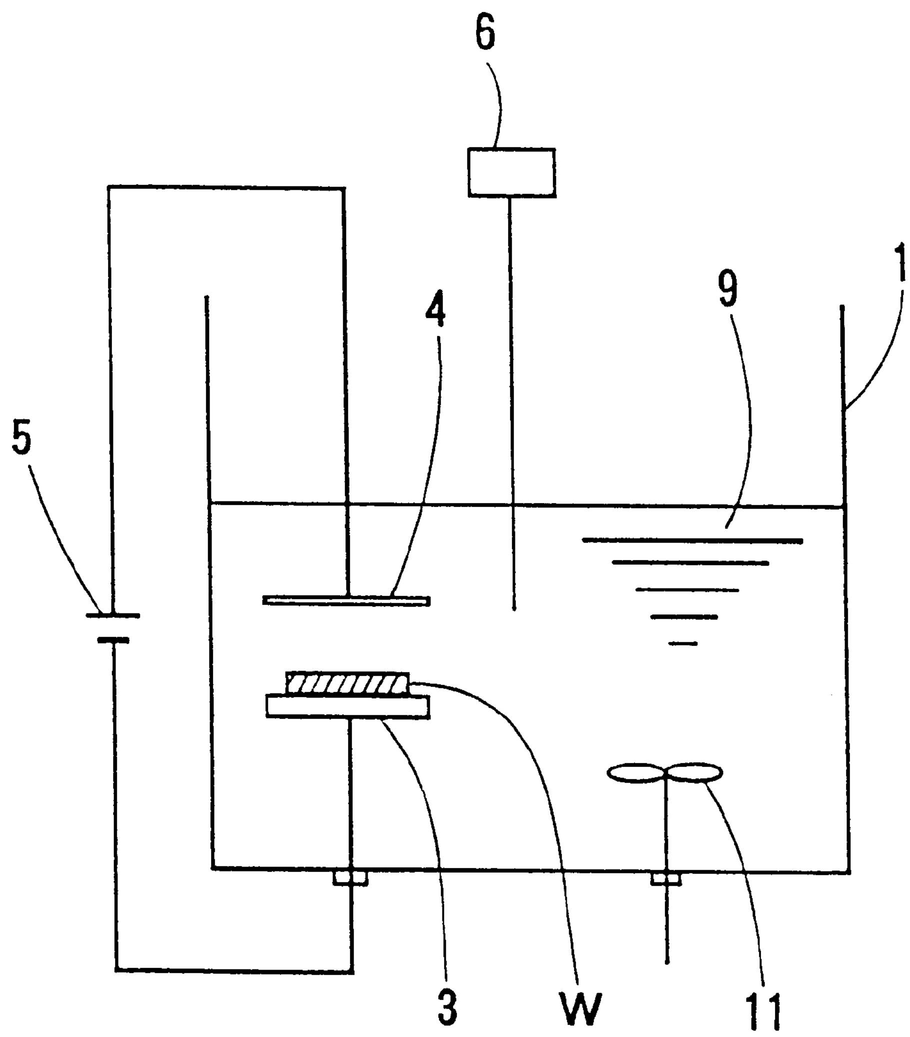
FIG. 7 is a schematic illustration of a conventional plating apparatus.

FIG. 1 is a schematic illustration of an embodiment of the pre-plating treatment apparatus comprised primarily by a processing chamber 53 which is a hermetically sealable chamber; a liquid (pre-plating treatment medium) delivery pipe 55, a gas exhaust pipe 57; a liquid discharge pipe 58 respectively connected to the processing chamber 53. A pressure gage 7 and a pressure switch 8 are attached to the processing chamber 53 and a processing temperature controller 78 and a holder 2 for holding a substrate W are housed inside the chamber 53.

Liquid delivery pipe 55 is provided with a storage tank 76, a pump 74, an adjusting valve 71, a check valve 75, a temperature adjuster 77 and a temperature sensor 6, and is used to introduce the liquid under pressure to the processing chamber 53. Gas exhaust pipe 57 has a shutoff valve 23 and a relief valve 36, and is able to exhaust gas safely from the processing chamber 53. Liquid discharge pipe 58 has a shutoff valve 24 and an adjusting valve 72, and manages discharging of the liquid from the processing chamber 53 under controlled pressure.

The method for pre-plating treatment using the apparatus presented above will be in the following. A substrate W having fine cavities 62 illustrated in FIG. 6 is placed inside the processing chamber 53, and the liquid is introduced into the processing chamber 53 through liquid delivery pipe 55 while, concurrently, air is removed from the processing chamber 53 through gas exhaust pipe 57. After the processing chamber 53 is filled with the liquid, shutoff valve 23 of the gas exhaust pipe 57 is closed, and using the pump 74 of the liquid delivery pipe 55, the processing chamber 53 is pressurized to a pressure above the critical pressure 22 MPa (226 kgf/cm$^2$). At this point, the temperature of the liquid in the processing chamber 53 is raised, using the processing temperature controller 78, to a temperature above the critical temperature 374° C. (647K). Pressure increase accompanying the temperature rise in the liquid is adjusted by removing the excess liquid through the adjusting valve 72 of the liquid discharge pipe 58.

By following such a procedure, the chamber 53 is maintained in a supercritical state, the liquid and a small amount of residual air in the processing chamber 53 now form a uniform single phase, and the fine cavities 62 become filled with a fluid comprised mainly by the liquid medium. Subsequently, using the processing temperature controller 78, the temperature of the processing chamber 53 is lowered, and concurrently the liquid is introduced from the liquid delivery pipe 55 to adjust the pressure inside the chamber 53 so that the liquid in the chamber is returned to the normal state of a room temperature and normal pressure without a vaporization stage. By following this procedure, it is possible to fill the cavities 62 formed on the substrate W with the pre-plating treatment medium. After filling the fine cavities with the liquid, the substrate is immersed in the plating solution to have the liquid replaced with the plating solution to perform plating operation.

FIG. 2 is a schematic illustration of another pre-plating treatment apparatus, and although this apparatus is substantially the same as the apparatus shown in FIG. 1, but it is different in one aspect that this apparatus is designed to introduce high temperature vapor as pre-plating treatment medium inside the chamber 53 to create a supercritical environment. In this case, processing chamber 53 as a hermetic chamber is comprised by: a vapor (pre-plating treatment medium) delivery pipe 91, a gas exhaust pipe 57 and a liquid discharge pipe 58 respectively connected to the processing chamber 53. A pressure gage 7 and a pressure switch 8 are attached to the chamber 53, and a substrate holder 2 and a processing temperature controller 78 are housed inside the chamber 53.

The vapor delivery pipe 91 has a pump 74, a boiler 79, a shutoff valve 31, an adjusting valve 71 and a temperature adjuster 80, and introduces high temperature and high pressure vapor as well as vapor at supercritical state to the chamber 53. Accordingly, it is possible to convert inside environment of the chamber 53 to a supercritical state via a vapor phase and revert the substance in the chamber 53 to normal temperature and pressure without having the liquid to vaporize inside the chamber, as does the apparatus shown in FIG. 1.

Although in the embodiments presented above, the pre-plating treatment medium is used in its supercritical state, but it is also permissible to use the medium in its subcritical state. Also, water or plating solution was used in these cases, but other medium such as alcohol may also be used. By using alcohol as a pre-plating treatment medium, a lower temperature and a lower pressure can be used to achieve the supercritical state. Also, after filling the fine cavities with alcohol, the substrate is immersed in the same or a different chamber to have the pre-plating treatment medium replaced with plating solution to perform plating operation.

Also in the above embodiments, only one substrate was treated, but it is desirable to process more than one substrate at a time from an energy saving and productivity viewpoints. In such a case, substrates may be placed in a cassette that can hold several substrates and may be immersed in the liquid, which can also facilitate transferring of substrates from the pre-plating treatment chamber to the plating chamber. Also, it is permissible to incorporate the treatment into a continuous process such that the chamber is designed to be usable both as a pre-plating treatment chamber and a plating chamber.

What is claimed is:

1. A method for producing a metal deposit inside fine cavities fabricated on a substrate, said method comprising:

disposing said substrate in a hermetic chamber;

filling said chamber with a treatment medium which is liquid at normal temperature and pressure;

maintaining said treatment medium within said chamber at a subcritical or supercritical state;

converting said treatment medium within said chamber into liquid phase without passing through a vapor phase by controlling pressure and temperature within said chamber so as to infiltrate said liquid-phase treatment medium into said fine cavities, wherein said maintaining and converting operations are performed in a sequential manner; and plating said substrate to produce a metal deposit inside said fine cavities.

2. A method according to claim 1, wherein said treatment medium is water or plating solution.

3. A method according to claim 1, wherein said treatment medium is a substance other than plating solution, said method further comprising replacing said treatment medium within said fine cavities with plating solution.

4. A method according to claim 1, wherein said treatment medium is a substance whose supercritical pressure or supercritical temperature is lower than supercritical pressure or supercritical temperature of water.

5. A method according to claim 1, wherein said treatment medium is alcohol.

6. A method according to claim 1, wherein said chamber is evacuated prior to filing with the treatment medium.

7. A method according to claim 1, wherein said treatment medium is supplied to said chamber in a liquid state.

8. A method according to claim 1, wherein said treatment medium is supplied to said chamber in a vapor state.

9. A method according to claim 8, wherein inner environment of said chamber is subjected to pressure variation during a process of introducing said treatment medium in a vapor phase.

10. A method for fabricating wiring by producing a metal deposit inside fine cavities fabricated on a substrate, said method comprising:

disposing said substrate in a hermetic chamber;

introducing a treatment medium which is liquid at normal temperature and pressure into said chamber;

maintaining said treatment medium within said chamber at a subcritical or supercritical state;

converting said treatment medium within said chamber to liquid phase without passing through a vapor phase by controlling pressure and temperature within said chamber so as to infiltrate said treatment medium into said fine cavities;

plating said substrate to produce a metal deposit inside said fine cavities; and removing unwanted metallic regions deposited on said substrate by chemical mechanical polishing.

* * * * *